(12) United States Patent
Liao et al.

(10) Patent No.: US 9,941,161 B2
(45) Date of Patent: Apr. 10, 2018

(54) METHOD FOR FABRICATING SEMICONDUCTOR DEVICE

(71) Applicant: UNITED MICROELECTRONICS CORP., Hsin-Chu (TW)

(72) Inventors: Duan Quan Liao, Singapore (SG); Yikun Chen, Singapore (SG); Ching Hwa Tey, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 161 days.

(21) Appl. No.: 14/838,374

(22) Filed: Aug. 28, 2015

(65) Prior Publication Data

US 2017/0040179 A1 Feb. 9, 2017

(30) Foreign Application Priority Data

Aug. 3, 2015 (CN) .......................... 2015 1 0479380

(51) Int. Cl.

| H01L 21/768 | (2006.01) |
|---|---|
| H01L 21/306 | (2006.01) |
| H01L 29/78 | (2006.01) |
| H01L 29/66 | (2006.01) |
| H01L 21/3105 | (2006.01) |
| H01L 21/283 | (2006.01) |

(52) U.S. Cl.
CPC ...... *H01L 21/76897* (2013.01); *H01L 21/283* (2013.01); *H01L 21/30625* (2013.01); *H01L 21/31051* (2013.01); *H01L 21/76829* (2013.01); *H01L 29/6653* (2013.01); *H01L 29/66545* (2013.01); *H01L 29/785* (2013.01)

(58) Field of Classification Search
None
See application file for complete search history.

(56) References Cited

U.S. PATENT DOCUMENTS

| 2011/0108928 A1* | 5/2011 | Tao ..................... H01L 21/3215 257/410 |
| 2013/0187236 A1* | 7/2013 | Xie ..................... H01L 29/4966 257/369 |
| 2014/0008720 A1* | 1/2014 | Xie ....................... H01L 27/092 257/331 |
| 2014/0264486 A1* | 9/2014 | Pham .................. H01L 29/4232 257/288 |
| 2014/0264487 A1* | 9/2014 | Pham ...................... H01L 29/78 257/288 |
| 2015/0021683 A1* | 1/2015 | Xie ..................... H01L 29/6653 257/330 |

(Continued)

OTHER PUBLICATIONS

Hung, Title of Invention: Semiconductor Device and Method of Forming the Same, U.S. Appl. No. 14/614,416, filed Feb. 5, 2015.

*Primary Examiner* — Mary Wilczewski
*Assistant Examiner* — Erik T Peterson
(74) *Attorney, Agent, or Firm* — Winston Hsu

(57) ABSTRACT

A method for fabricating semiconductor device is disclosed. The method includes the steps of: providing a substrate having a gate structure thereon, a first hard mask atop the gate structure, and an interlayer dielectric (ILD) layer around the gate structure and the first hard mask; removing part of the first hard mask; forming a second hard mask layer on the first hard mask and the ILD layer; and planarizing part of the second hard mask layer to form a second hard mask on the first hard mask.

12 Claims, 9 Drawing Sheets

(56) References Cited

U.S. PATENT DOCUMENTS

| | | | | |
|---|---|---|---|---|
| 2015/0035086 A1* | 2/2015 | Xie | ................... | H01L 29/66545 |
| | | | | 257/411 |
| 2015/0126023 A1* | 5/2015 | Choi | ................ | H01L 21/28158 |
| | | | | 438/591 |
| 2015/0364326 A1* | 12/2015 | Xie | .................... | H01L 29/6653 |
| | | | | 257/288 |
| 2016/0293725 A1* | 10/2016 | Liou | ................ | H01L 29/66545 |
| 2016/0315007 A1* | 10/2016 | Liou | .................. | H01L 23/5226 |
| 2016/0315171 A1* | 10/2016 | Hung | ............... | H01L 29/66545 |

\* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly, to a method of forming two hard masks on gate structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of metal gate and contact plugs still faces some issues in conventional FinFET fabrication. For instance, multiple masks are often required to form contact holes after formation of metal gates, causing significant increase in cost. Hence, how to improve the current FinFET fabrication and structure for resolving this issue has become an important task in this field.

SUMMARY OF THE INVENTION

According to a preferred embodiment of the present invention, a method for fabricating semiconductor device is disclosed. The method includes the steps of: providing a substrate having a gate structure thereon, a first hard mask atop the gate structure, and an interlayer dielectric (ILD) layer around the gate structure and the first hard mask; removing part of the first hard mask; forming a second hard mask layer on the first hard mask and the ILD layer; and planarizing part of the second hard mask layer to form a second hard mask on the first hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
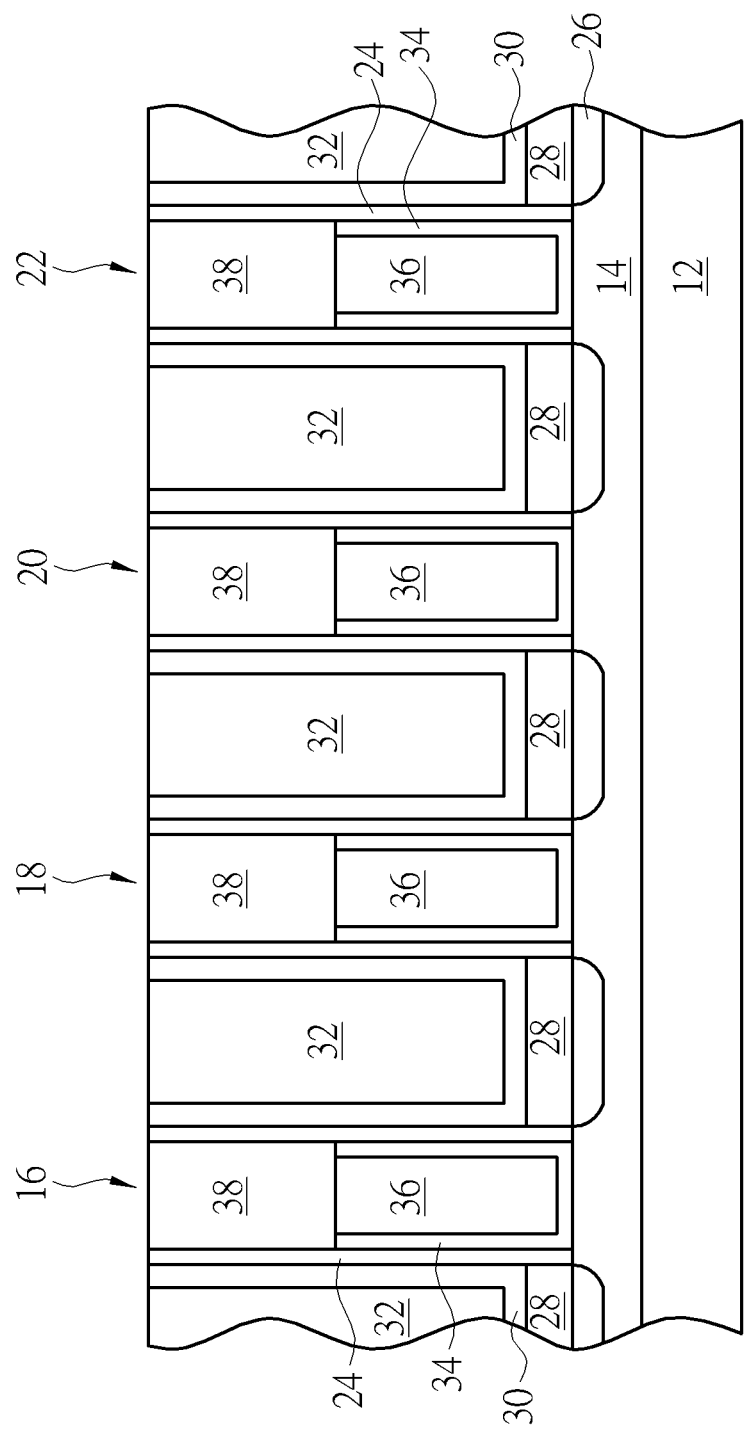
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures 16, 18, 20, 22 are formed on part of the fin-shaped structure 14. It should be noted that even though four gate structures are disclosed in this embodiment, the quantity of the gate structures is not limited to four, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structures 16, 18, 20, 22 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14, and a spacer 24 is formed on the sidewall of the dummy gates. A source/drain region 26 and/or epitaxial layer 28 are then formed in the fin-shaped structure 14 and/or substrate 12 adjacent to two sides of the spacer 24, a silicide layer (not shown) could be selectively formed on the source/drain region 26 and/or epitaxial layer 28, a contact etch stop layer (CESL) 30 is formed on the dummy gates, and an interlayer dielectric (ILD) layer 32 composed of material such as tetraethyl orthosilicate (TEOS) is formed on the CESL 30.

Next, a replacement metal gate (RMG) process could be conducted to planarize part of the ILD layer 32 and CESL 30 and then transform the dummy gates into gate structures 16, 18, 20, 22 composed of metal gates. The RMG process could be accomplished by first performing a selective dry etching or wet etching process, such as using etchants including ammonium hydroxide ($NH_4OH$) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surfaces of the U-shaped work function layer 34 and low resistance metal layer 36 are even with the surface of the ILD layer 32. Depending on the high-k first approach or high-k last approach being conducted, the cross-section of high-k dielectric layer (not shown) could be either I-shaped or U-shaped.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the gate structures 16, 18, 20, 22, an etching process could be conducted to remove part of the work function metal layer 34 and low resistance metal layer 36 for forming a recess (not shown) in each of the gate structures 16, 18, 20, 22 while not removing any of the spacer 24, CESL 30, and ILD layer 32. A hard mask 38 is then formed in each recess, and a CMP process is conducted so that the top surfaces of the hard masks 38 and ILD layer 32 are coplanar. Preferably, the hard mask 38 could be a single layered material layer or a composite material layer, in which the hard mask 38 could be selected from the group consisting of silicon oxide, silicon nitride, silicon oxynitride, and silicon carbon nitride.

Figure 2:
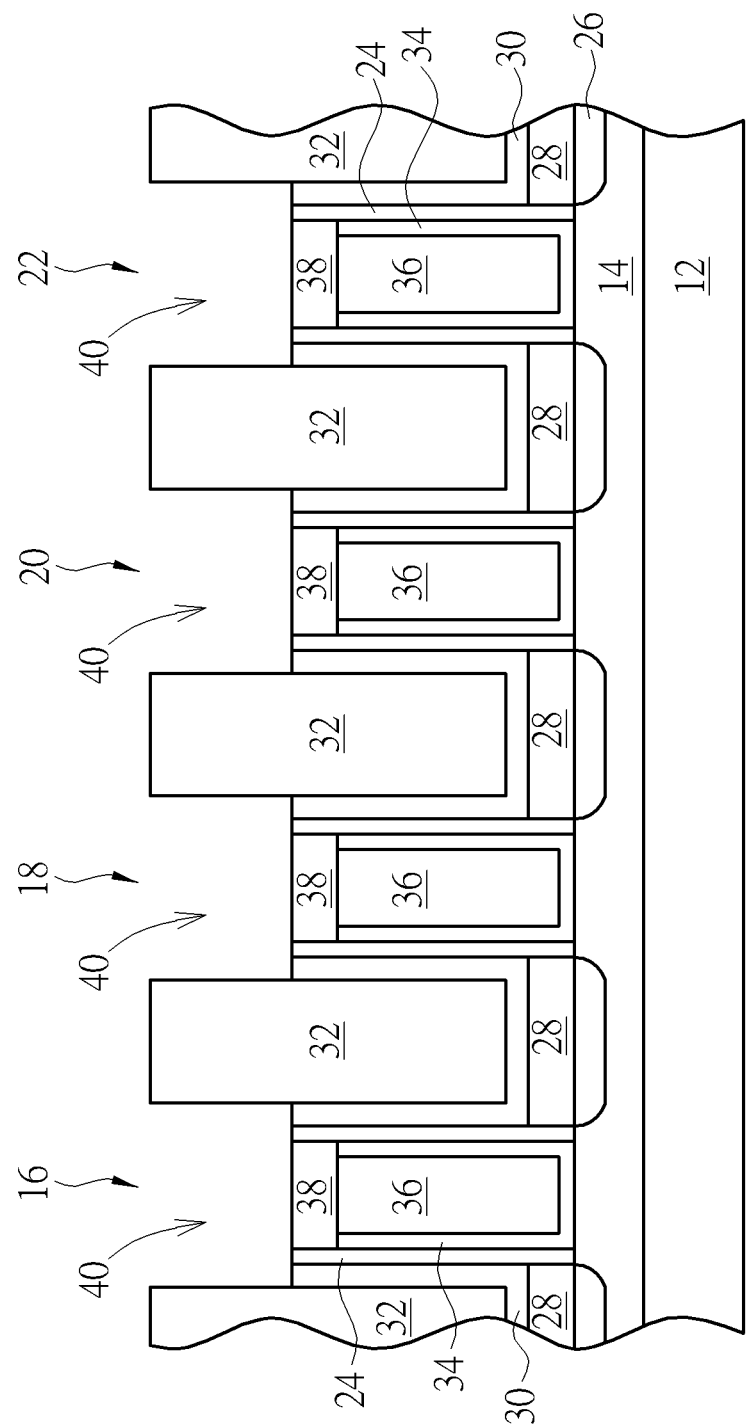

Next, as shown in FIG. 2, another etching process is conducted to remove part of the hard masks 38, part of the spacers 24, and part of the CESL 30 to form recesses 40 on the gate structures 16, 18, 20, 22, or more specifically, on the remaining hard masks 38, spacer 24, and CESL 30 of each of the gate structures 16, 18, 20, 22.

Figure 3:
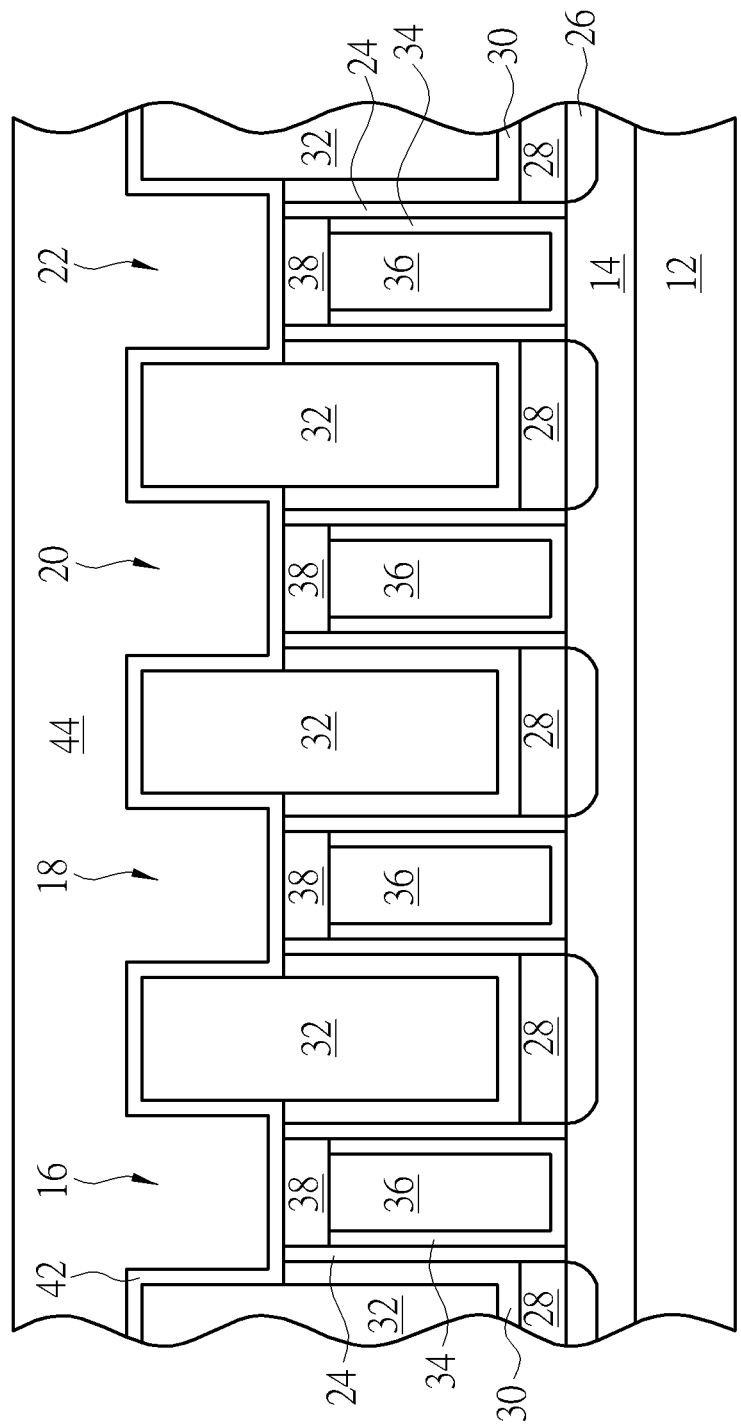

Next, as shown in FIG. 3, a cap layer 42 composed of silicon oxide could be formed selectively on the hard masks 38 and ILD layer 32, and a hard mask layer 44 is formed on the hard masks 38, spacers 24, CESL 30, and ILD layer 32 to fill the recesses 40. In this embodiment, the hard masks 38 and the hard mask layer 44 are preferably composed of different material, in which the hard mask layer 44 could be selected from the group consisting of Ti, TiN, Ta, and TaN, and most preferably TiN. It should be noted that even though a cap layer 42 is formed between the hard mask layer 44 and the hard masks 38 in this embodiment, it would also be desirable to deposit the hard mask layer 44 directly on top of the hard masks 38 without forming any cap layer 42 in between, which is also within the scope of the present invention.

Figure 4:
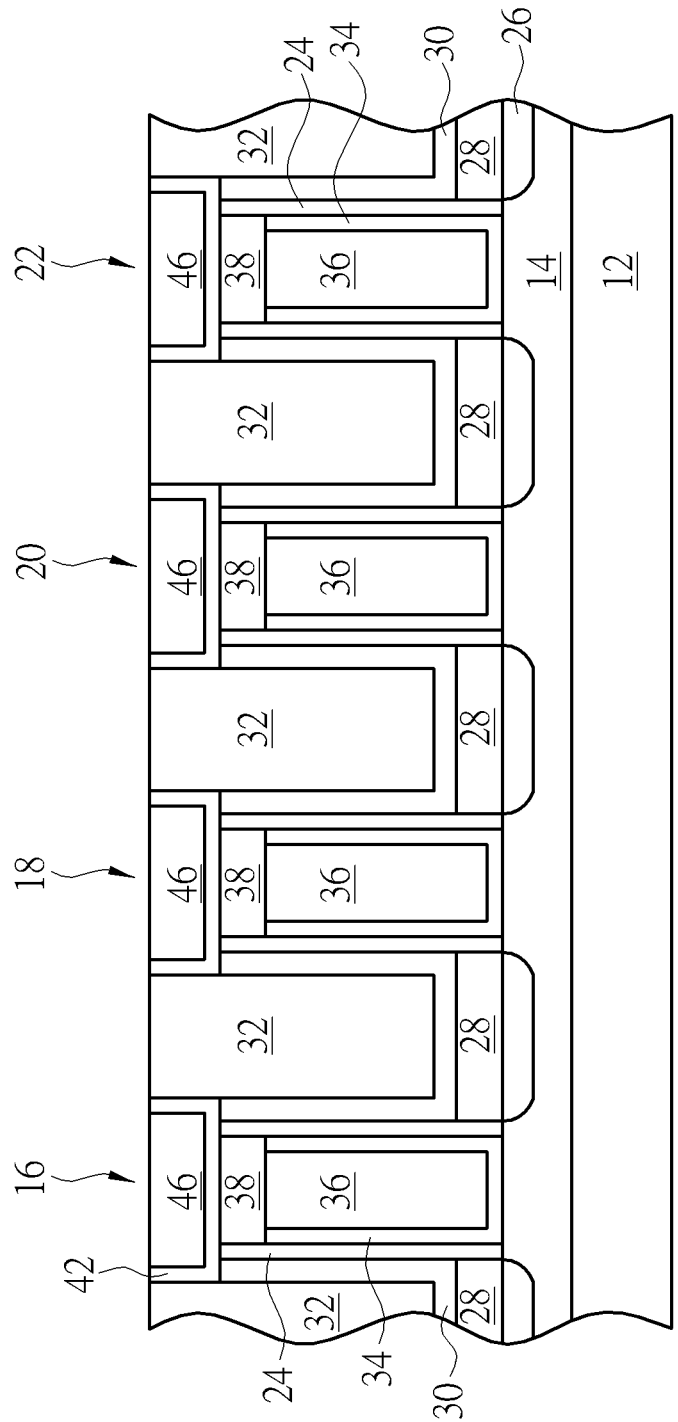

Next, as shown in FIG. 4, a planarizing process, such as CMP is conducted to remove part of the hard mask layer 44, part of the cap layer 42, and even part of the ILD layer 32 to form another hard mask 46 on each hard mask 38. Preferably, the hard masks 46 are constituted by the planarized hard mask layer 44, in which the top surfaces of the hard masks 46 and cap layer 42 are even with the top surface of the ILD layer 32. It should be noted that since part of the spacers 24 and CESL 30 were removed before the formation of the recesses 40, the width of each hard mask 46 is greater than the width of each hard mask 38.

Figure 5:
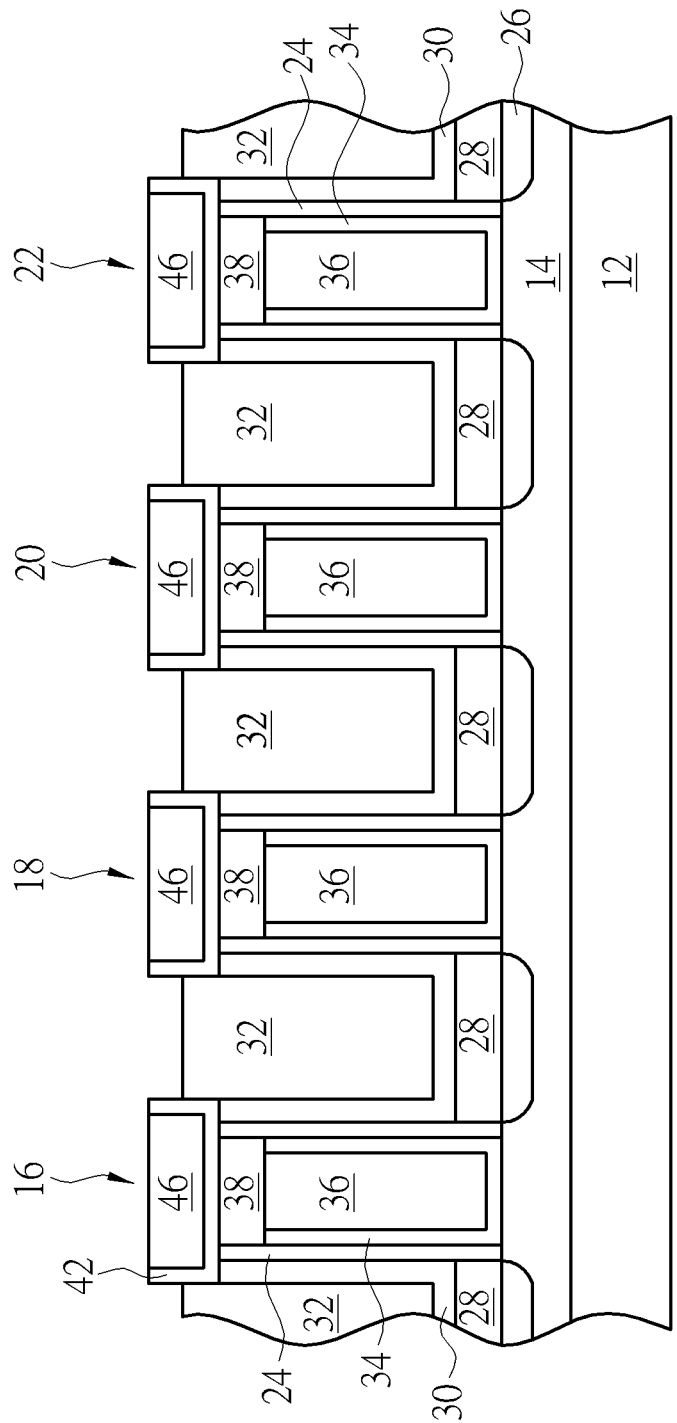

Next, as shown in FIG. 5, an etching process could be conducted selectively by using the hard masks 46 as mask to remove part of the ILD layer 32 adjacent to the gate structures 16, 18, 20, 22 so that the remaining ILD layer 32 surface is slightly lower than the top surface of the hard masks 46.

Figure 6:
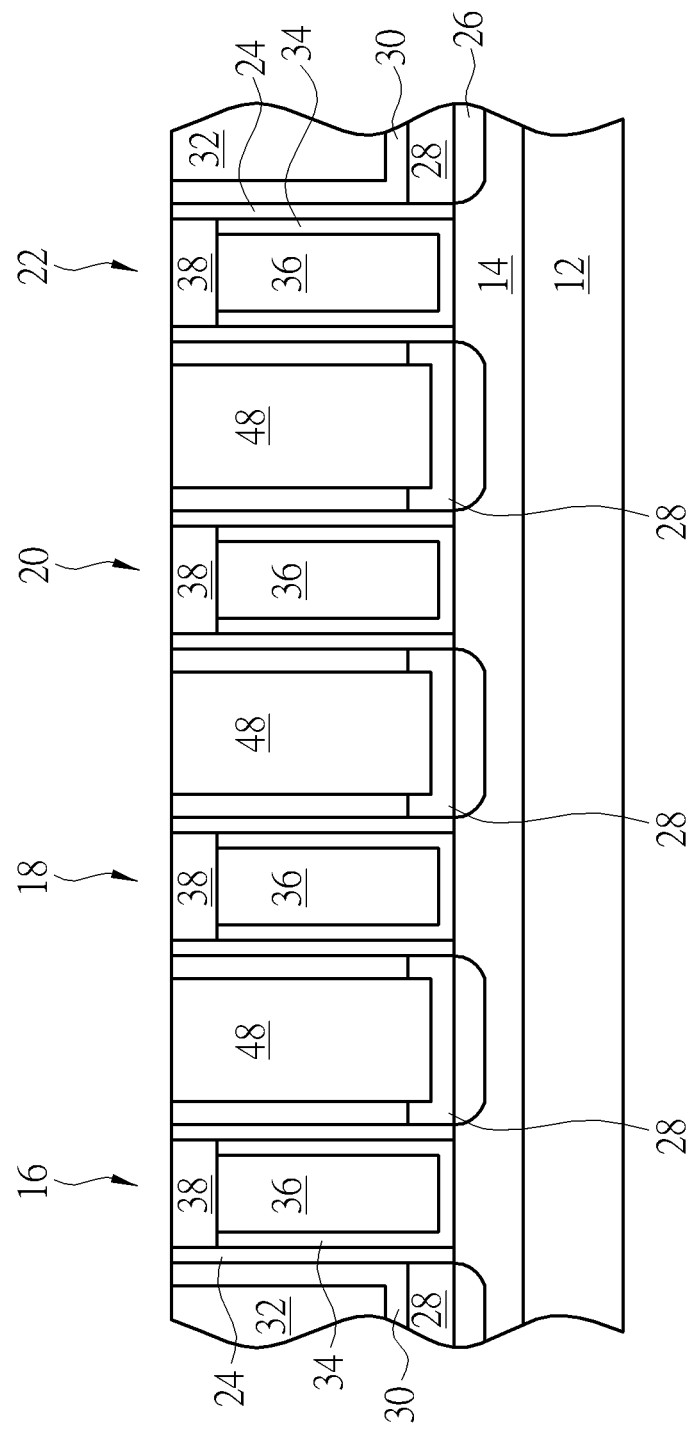

Next, as shown in FIG. 6, another etching process is conducted by using a patterned resist (not shown) and hard masks 46 as mask to remove part of the ILD layer 32 between the gate structures 16, 18, 20, 22 for forming contact holes (not shown) exposing the epitaxial layers 28 underneath. After removing the hard masks 46 and cap layer 42, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted by using the hard masks 38 as stop layer to remove part of aforementioned barrier layer and low resistance metal layer for forming contact plugs 48 electrically connecting the gate structures 16, 18, 20, 22 and source/drain regions 26. This completes the fabrication of a semiconductor device according to a preferred embodiment of the present invention. Alternatively, it would also be desirable to deposit barrier layer and low resistance metal layer into the contact holes and then use planarizing process to remove simultaneously remove part of the barrier layer, part of the low resistance metal layer, and all of the hard masks 46 by using hard masks 38 as stop layer for forming contact plugs 48 in the contact holes, which is also within the scope of the present invention.

Figure 7:
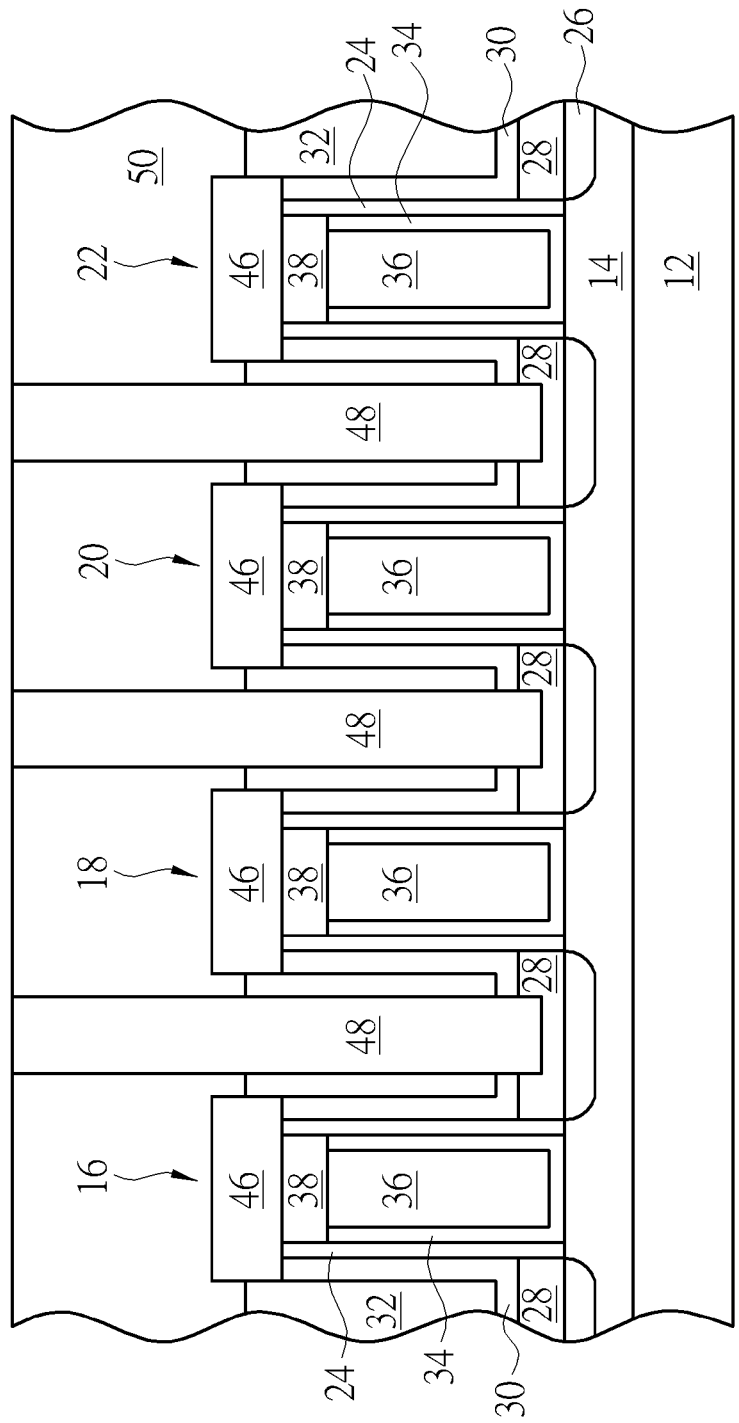
FIG. 7 illustrates a method for fabricating semiconductor device according to an embodiment of the present invention.

Referring to FIG. 7, which illustrates another embodiment of the present invention, in which the hard masks 46 and 38 could be retained if the hard masks 46 were made of non-conductive material. For instance, as shown in FIG. 7, a dielectric layer 50 could be formed on top of the gate structures 16, 18, 20, 22 and the hard masks 46, and another etching process is conducted by using a patterned resist (not shown) as mask to remove part of the dielectric layer 50 and part of the ILD layer 32 between the gate structures 16, 18, 20, 22 for forming contact holes (not shown) exposing the epitaxial layers 28 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted by using the hard masks 38 as stop layer to remove part of aforementioned barrier layer and low resistance metal layer for forming contact plugs 48 electrically connecting the gate structures 16, 18, 20, 22 and source/drain regions 26. This completes the fabrication of a semiconductor device according to an embodiment of the present invention.

Figure 8:
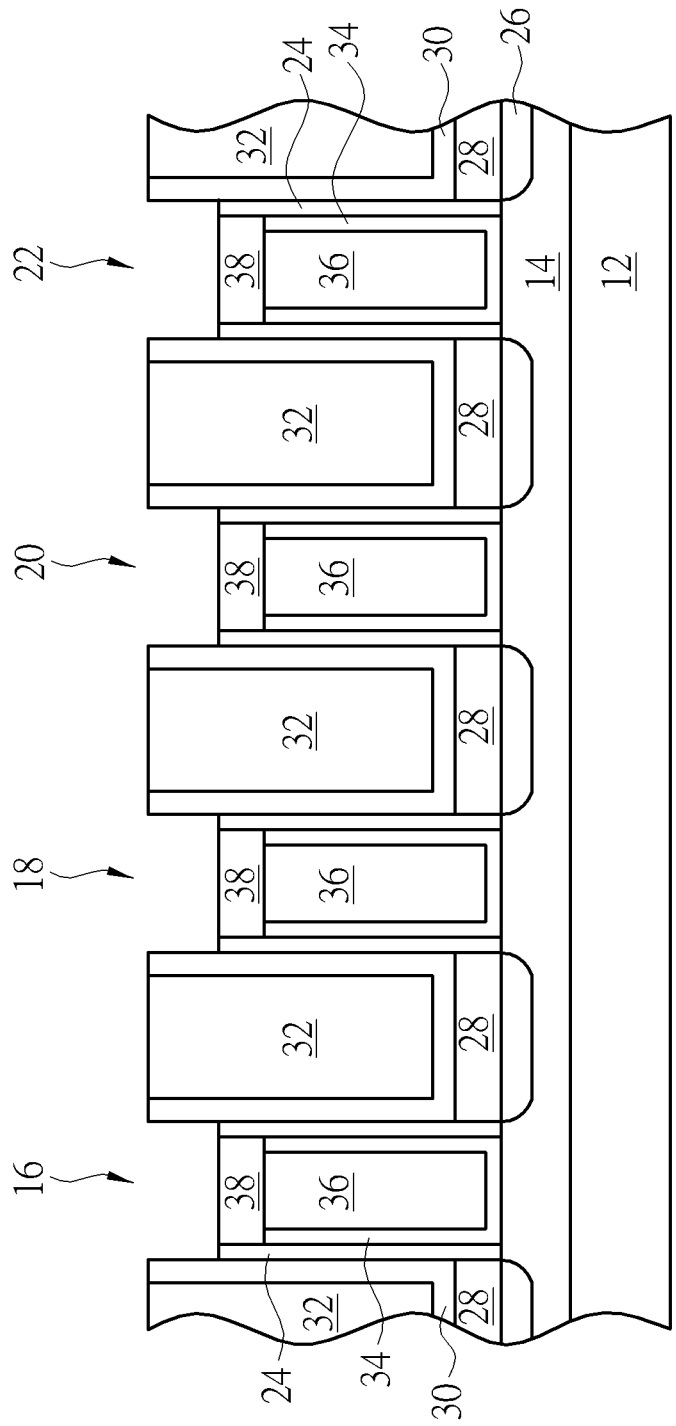
FIGS. 8-9 illustrate a method for fabricating semiconductor device according to another embodiment of the present invention.
Figure 9:
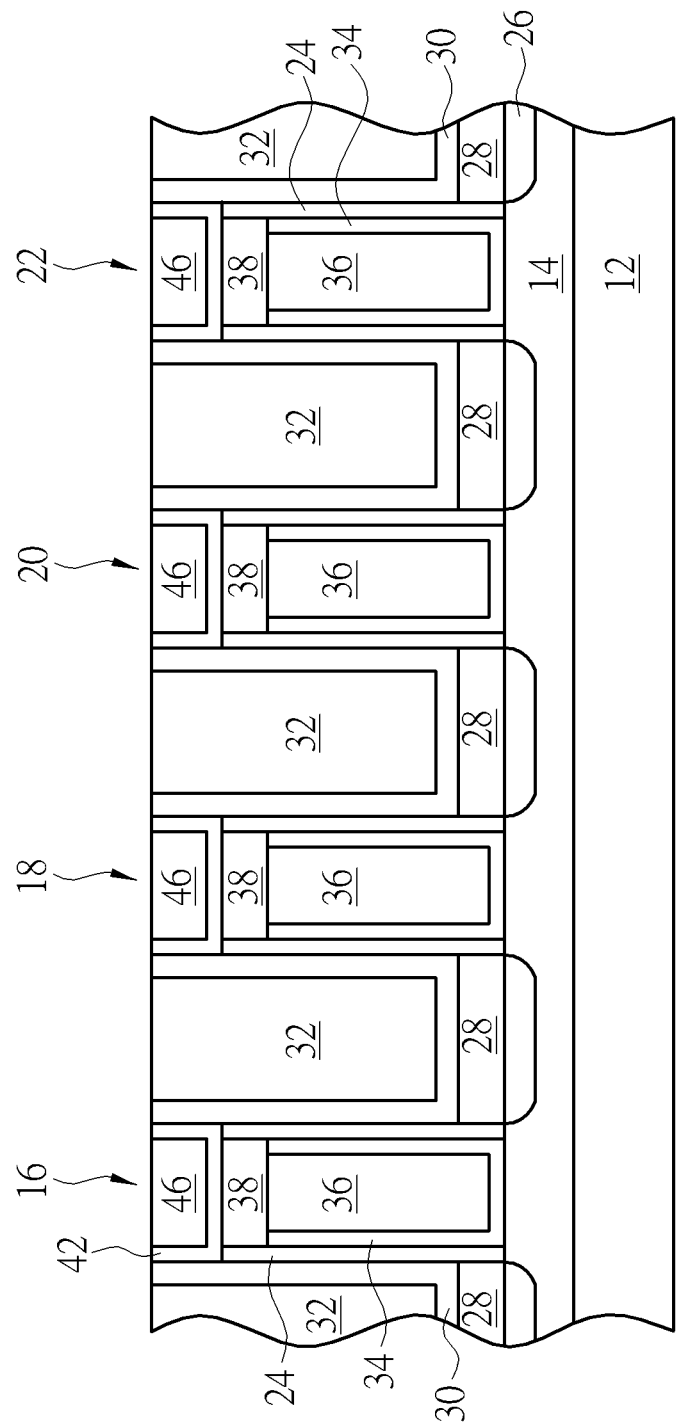

Referring to FIGS. 8-9, FIGS. 8-9 illustrate a method for fabricating semiconductor device according to another embodiment of the present invention. As shown in FIGS.

8-9, instead of etching part of the hard masks 38, part of the spacers 24, and part of the CESL 30 to form recesses 40 as shown in FIG. 2, only part of the hard masks 38 and part of spacers 24 are removed through etching process while none of the CESL 30 is removed. In other words, the top surface of the CESL 30 and the top surface of the ILD layer 32 would be coplanar after part of hard masks 38 and part of spacers 24 are removed while the top surfaces of the hard masks 38 and spacers 24 are coplanar.

Next, similar to the steps shown in FIG. 3, a cap layer (not shown) composed of silicon oxide and hard mask layer (not shown) composed of silicon nitride could be formed on the hard masks 38, spacers 24, CESL 30, and ILD layer 32 to fill the recesses 40. Since the CESL 30 was not removed in the previous step, the hard mask layer deposited in the recesses 40 is disposed only on the hard masks 38 and spacers 24 while the hard mask layer outside the recesses 40 is disposed on the ILD layer 32 and CESL 30.

Next, as shown in FIG. 9, a planarizing process such as CMP process is conducted to remove part of the hard mask layer, part of the cap layer, and even part of the ILD layer 32 to form another hard mask 46 on each hard mask 38, in which the top surface of the hard masks 46 is even with the top surfaces of the ILD layer 32 and CESL 30.

Similarly, it would be desirable to perform an etching process by using hard masks 46 as mask to remove part of the ILD layer 32 adjacent to the gate structures 16, 18, 20, 22 as shown in FIG. 5 so that the top surface of the remaining ILD layer 32 is slightly lower than the top surface of the hard masks 46.

Overall, the present invention preferably removes part of the first hard mask on top of metal gate, forms a second hard mask layer on the first hard mask and ILD layer, and then conducts a planarizing process to remove part of the second hard mask layer to form a second hard mask atop the first hard mask. The second hard mask could then be used as mask to remove part of the ILD layer adjacent to the metal gate for forming contact holes, and the second hard mask and first hard mask are removed thereafter. Preferably, the number of masks could be reduced substantially by using the aforementioned approach to form contact plugs connecting the metal gates and source/drain regions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a gate structure thereon, a first hard mask atop the gate structure, and an interlayer dielectric (ILD) layer around the gate structure and the first hard mask;
   removing part of the first hard mask;
   forming a second hard mask layer on the first hard mask and the ILD layer; and
   planarizing part of the second hard mask layer and part of the ILD layer at the same time to form a second hard mask on the first hard mask.

2. The method of claim 1, wherein the width of the second hard mask is greater than the width of the first hard mask.

3. The method of claim 1, wherein a spacer and a contact etch stop layer (CESL) are formed adjacent to the gate structure and the first hard mask, the method further comprises:
   removing part of the first hard mask and part of the spacer; and
   forming the second hard mask on the first hard mask and the spacer.

4. The method of claim 1, wherein a spacer and a contact etch stop layer (CESL) are formed adjacent to the gate structure and the first hard mask, the method further comprises:
   removing part of the first hard mask, part of the spacer, and part of the CESL; and
   forming the second hard mask on the first hard mask, the spacer, and the CESL.

5. The method of claim 1, wherein the first hard mask and the second hard mask comprise different material.

6. The method of claim 1, wherein the second hard mask comprises TiN.

7. The method of claim 1, further comprising forming a cap layer on the first hard mask and the ILD layer before forming the second hard mask layer.

8. The method of claim 7, wherein the cap layer comprises an oxide layer.

9. The method of claim 1, further comprising removing part of the ILD layer after forming the second hard mask.

10. The method of claim 1, further comprising using the second hard mask to form a contact hole adjacent to the gate structure after planarizing part of the second hard mask layer.

11. A method for fabricating semiconductor device, comprising:
    providing a substrate having a gate structure thereon, a spacer around the gate structure, a contact etch stop layer (CESL) adjacent to the spacer, a first hard mask atop the gate structure, and an interlayer dielectric (ILD) layer around the gate structure and the first hard mask;
    removing part of the first hard mask and part of the spacer simultaneously so that a top surface of the first hard mask and the spacer is lower than a top surface of the CESL;
    forming a second hard mask layer on the first hard mask and the ILD layer; and
    planarizing part of the second hard mask layer to form a second hard mask on the first hard mask.

12. The method of claim 11, wherein the top surfaces of the second hard mask and the CESL are coplanar.

* * * * *